US 6,693,956 B1

(12) United States Patent
Yamamoto

(10) Patent No.: US 6,693,956 B1
(45) Date of Patent: Feb. 17, 2004

(54) POWER AMPLIFIER HAVING NEGATIVE FEEDBACK CIRCUIT FOR TRANSMITTER

(75) Inventor: Hiroyuki Yamamoto, Kodaira (JP)

(73) Assignee: Hitachi Denshi Kabushiki Kaisha, Tokyo (JP)

( * ) Notice: Subject to any disclaimer, the term of this patent is extended or adjusted under 35 U.S.C. 154(b) by 476 days.

(21) Appl. No.: 09/672,688

(22) Filed: Sep. 29, 2000

(30) Foreign Application Priority Data

Oct. 8, 1999 (JP) .......................................... 11-288156

(51) Int. Cl.[7] .............................. H04L 5/16; H04L 25/49
(52) U.S. Cl. ..................................... 375/219; 375/297
(58) Field of Search ............................. 375/222, 219, 375/326, 295, 316, 297, 308, 346, 332, 340, 261, 298; 329/304, 306; 332/103, 104; 455/73, 84, 69, 70

(56) References Cited

U.S. PATENT DOCUMENTS 6,188,732 B1 * 2/2001 Rha ............................ 375/297
6,381,230 B1 * 4/2002 Wheatley et al. ............ 370/328
6,553,018 B1 * 4/2003 Ichihara ....................... 370/342

* cited by examiner

*Primary Examiner*—Tesfaldet Bocure
(74) *Attorney, Agent, or Firm*—Antonelli, Terry, Stout & Kraus, LLP

(57) ABSTRACT

A power amplifier having a negative feedback circuit for a transmitter and a control method for its phase are arranged as follows. An I-component baseband signal is added to an I-component baseband feedback signal for producing an I-component adding signal. A Q-component baseband signal is added to a Q-component baseband feedback signal for producing a Q-component adding signal. A modulator orthogonally modulates a carrier signal by the I-component adding signal and the Q-component adding signal. An amplifying circuit operates to amplify the quadrature-modulated signal. A demodulating circuit orthogonally demodulates the part of the output of the amplifying circuit and the carrier signal and then outputs the I-component baseband feedback signal and the Q-component baseband feedback signal. Then, the phase of a selected one of the I-component baseband signal and the Q-component baseband signal is compared with the phase of the adding signal corresponding to the selected component baseband signal for detecting if a phase shift exists. If a phase shift exists, the phase of the carrier signal is adjusted so that the phase shift may be made smaller.

6 Claims, 9 Drawing Sheets

(SIGNAL OF 4 KHz IS SHIFTED ONE DEGREE)

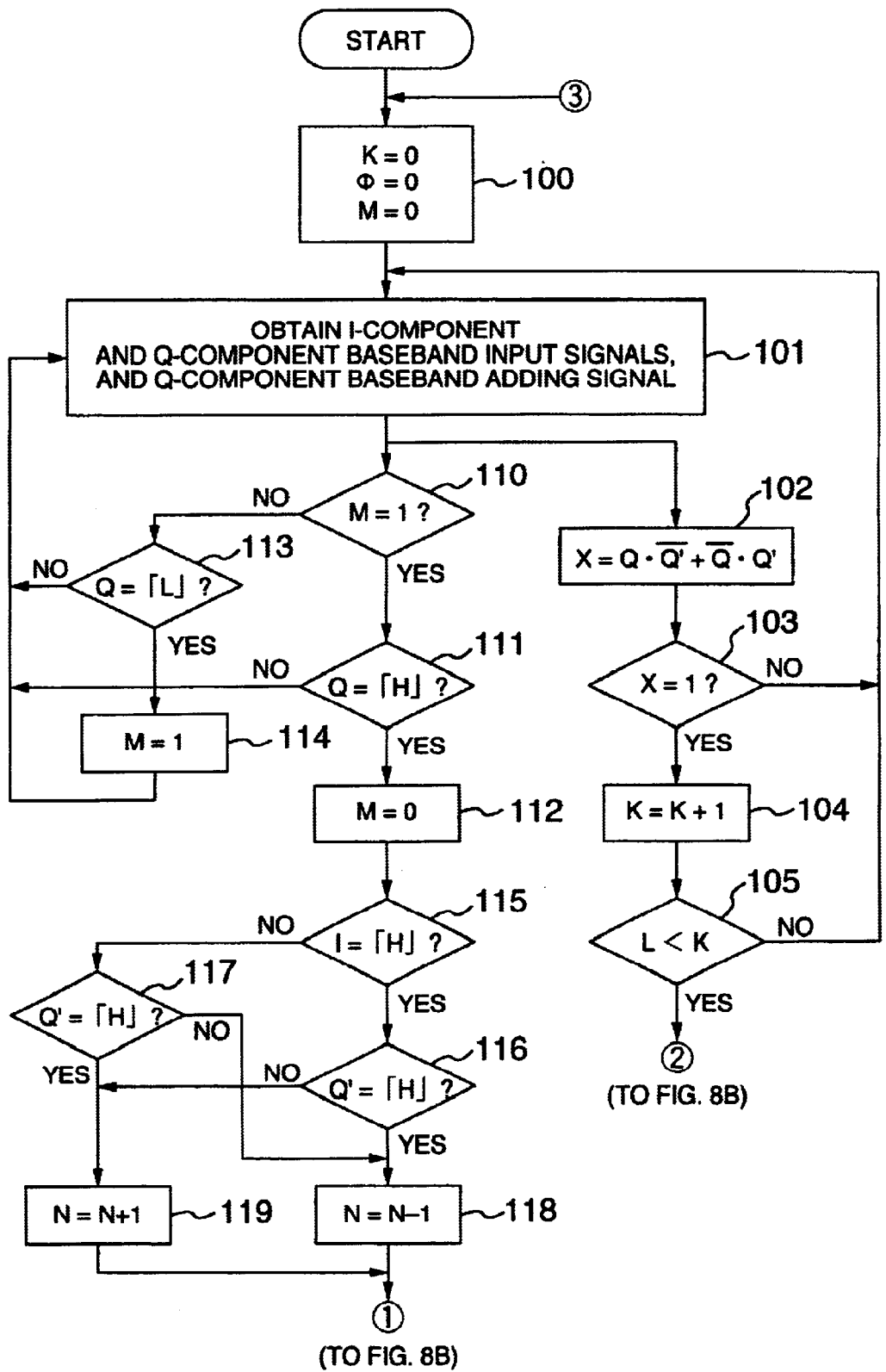

POWER AMPLIFIER HAVING NEGATIVE FEEDBACK CIRCUIT FOR TRANSMITTER

BACKGROUND OF THE INVENTION

The present invention relates to a power amplifier having a negative feedback circuit for a transmitter and more particularly to a negative feedback circuit for compensating for a nonlinear distortion used in the transmitter and a method for controlling the phase of the circuit in the power amplifier.

A radio system arranged to use a linear digital modulation system such as 16QAM (Quadrature Amplitude Modulation) or π/4 shift QPSK (Quadrature Phase Shift Keying) essentially needs nonlinear distortion compensation for a power amplifier. In actual, the radio system utilizes various kinds of nonlinear distortion compensating systems (linearizers). Of those systems, a Cartesian loop negative feedback type linearizer has been conventionally used. The conventional linear feedback amplifier will be described with reference to FIG. 2. FIG. 2 is a block diagram showing an arrangement of a transmitting section of a digital radio transmitter provided with the Cartesian loop negative feedback type linenarizer.

A numeral 1 denotes a baseband signal generator, which operates to output an in-phase component (called an I-component) and a quadrature component (called a Q-component) of a baseband signal. The I-component is added to the feedback signal in an adder 2-1 and then the added signal is outputted and is applied into a loop filter 3-1. Likewise, the Q-component is added to the feedback signal in the adder 2-2 and then the added signal is applied into a loop filter 3-2. The loop filters 3-1 and 3-2 operate to restrict the bandwidths of the I-component and the Q-component and then apply the resulting components into a quadrature modulator 4.

A numeral 11 denotes a reference signal generator, which operates to generate a reference frequency signal and then apply the reference signal into PLL frequency synthesizers 12 and 13. The PLL frequency synthesizer 12 operates to generate a first local oscillating signal (called an LO signal) on the basis of the reference signal and then apply a first LO signal into a quadrature modulator 4 and a phase shifter 18. The PLL frequency synthesizer 13 operates to generate a second LO signal on the basis of the reference signal and then apply the second LO signal into mixers 6 and 15. The phase shifter 18 operates to control the phase of the first LO signal through the use of a control signal to be applied from a phase controller 19 and then apply the first LO signal whose phase is controlled into the quadrature demodulator 16.

The quadrature modulator 4 operates to orthogonally modulate the first LO signal (carrier) into a signal of an intermediate frequency band (called an IF frequency band) by the I-component I' and the Q-component Q' of the baseband signal to be applied therein. Then, the modulated signal is applied into a bandpass filter (BPF) 5. The bandpass filter 5 operates to remove unnecessary components from the modified signal and then apply the resulting signal into the mixer 6. The mixer 6 operates to convert the signal applied therein into a desired frequency through the use of the second LO signal outputted from the PLL frequency synthesizer 13 and then apply the converted signal into a bandpass filter (BPF) 7. The bandpass filter 7 operates to remove unnecessary spurious components from the applied signal and then send the resulting signal into the power amplifier (PA) 8. The power amplifier 8 operates to amplify the input signal up to a specified output level and then transmit the amplified signal through an antenna 9.

This negative feedback amplifier is arranged as a negative feedback linearizer based on the Cartesian loop. Hence, part of the output signal of the power amplifier 8 is fed back through a directivity coupler 10 and then is given to an attenuator (ATT) 14. The attenuator 14 operates to adjust the power level of the input signal into a proper value and then give it to the mixer 15. The mixer 15 operates to convert the signal applied from the attenuator 14 into the IF frequency through the use of the second LO signal and then apply the converted signal into the quadrature demodulator 16.

The quadrature demodulator 16 operates to produce respectively the baseband signals i and q of the I- and the Q-components by orthogonally demodulate the converted signal using the first LO signal applied from the phase shifter 18. The I-component is applied as the I-component i of the feedback signal into a subtracting input side of the adder 2-1 through a switch 20-1, while the Q-component is applied as the Q-component q of the feedback signal into the subtracting input side of the adder 2-2 through a switch 20-2. At this time, the output sides of the switches 20-1 and 20-2 are connected to the adders 2-1 and 2-2, respectively.

In this type of negative feedback, for stabilizing the system, it is necessary to keep the input signals I and Q the same as the feedback signals i and q in phase (no phase difference) on the input sides of the adders 2-1 and 2-2. That is, if the phase difference takes place between the input signal and the feedback signal, it is necessary to make the phase difference zero by controlling the phase to be shifted by a radian at the maximum.

In turn, the method for controlling the phase will be described below. At first, the switches 20-1 and 20-2 shown in FIG. 2 are switched to be connected to the phase controller 19 so that the feedback loop is held in an open state.

The baseband signal generator 1 operates to apply a predetermined DC voltage into only the I-component for the purpose of adjusting the phase. The Q-component is kept zero (Q=0). In this state, the quadrature modulation is proceeded along the foregoing operation and then the signal is sent out through the antenna 9. Then the output waveform of the power amplifier 8 takes a non-modulated carrier. The output of the power amplifier 8 is partially fed back by the directivity coupler 10. Consider the output of the feedback signal of the quadrature demodulator 16 along the foregoing operation. If the phases coincide with each other, the DC voltage appears only on the I-component side, while no signal (DC) appears only on the Q-component side. However, if the phases do not coincide with each other, the DC voltage corresponding to the phase shift appears on the output of the Q-component side. Hence, the angle of rotation of the phase can be derived from the DC voltages of the I and the Q-components.

In the phase controller 19, the phase corresponding to the derived angle of rotation is reversely controlled by controlling the phase shifter 18 so that the phase of the first LO signal may be adjusted. By coinciding the output of the feedback signal of the quadrature demodulator 16 with the input signal, the negative feedback may be stabilized. Since the phase fit of the input signal and the feedback signal makes the output on the Q-component side zero, then the switches 20-1 and 20-2 are changed to the adders 2-1 and 2-2, respectively, so that the loop is made closed.

In the foregoing prior art, each time the phase is adjusted, it is necessary to open and close the feedback loop. It means that the loop is open while the phase is being adjusted. Hence, the phase adjustment cannot be executed for the change of phase while the transmission is in operation (closed loop). Further, the switching means for opening and closing the loop is located so that the phase may be controlled by the DC voltage of the feedback signal on the input side of the switching means. Hence, the voltage drop in the switching means in the open loop is different from that in the closed loop, so that the compensation of the offset voltage of the system set in the closed loop is not adaptive to the open loop. It means that the precise phase control cannot be executed. Further, if the phase is changed by changing the phase characteristic because of the temperature variation and the gain variation, the phase variation cannot be detected.

If the operation is continued as the phase is being shifted from the fitted phase, the overall system is made to have no phase allowance and in the worst case the oscillating phenomenon may take place. In the process, the spurious signal may be generated so that the output operation characteristic may be degraded.

In U.S. Pat. No. 5,066,923 issued on Nov. 19, 1991 to Gailus et al., a method has been disclosed for switching the feedback loop as shown in FIG. 2 into the open loop, for adjusting the phase. In the specification disclosed in the Japanese Patent No. 2746133 assigned to Nippon Electric, Ltd., the invention has been disclosed for adjusting the phase as keeping the closed loop. The latter invention, however, essentially needs both of the I-component and the Q-component as the feedback signal for the purpose of detecting the phase difference and compares the input baseband I-component with the feedback I-component in phase and the input baseband Q-component with the feedback Q-component in phase. The invention hence needs a complicated circuit.

SUMMARY OF THE INVENTION

It is an object of the present invention to provide a power amplifier having a feedback circuit of a transmitter which is arranged to control the phase for constantly keeping the output operation characteristic stable even while the feedback loop is operating in the closed state and a method for controlling the phase of the feedback circuit.

The feedback circuit of a transmitter and the method for controlling the phase of the feedback circuit according to the invention are arranged as follows. An adder operates to add an I-component baseband input signal to an I-component baseband feedback signal to produce an I-component adding signal and add a Q-component baseband input signal to a Q-component baseband feedback signal to produce a Q-component adding signal. An oscillator operates to generate a carrier signal. A modulator performs quadrature modulation with respect to the carrier signal through the use of the I-component adding signal and the Q-component adding signal. An amplifier circuit operates to amplify the quadrature-modulated signal. A demodulator performs orthogonal demodulation with respect to the part of the output of the amplifier circuit by the carrier signal and then outputs the I-component baseband feedback signal and the Q-component baseband feedback signal. Then, the phase of a selected one of the I-component baseband input signal and the Q-component baseband input signal is compared with the phase of the adding signal of the same component as that of the selected component baseband signal, for the purpose of detecting if a phase shift exists. If the phase shift exists, the phase of the carrier signal is adjusted so that the phase shift may be reduced.

BRIEF DESCRIPTION OF THE DRAWINGS

FIGS. 8A and 8B are flowcharts showing the implementations of the phase controller according to an embodiment of the invention with software.

DESCRIPTION OF THE EMBODIMENTS

Figure 1:
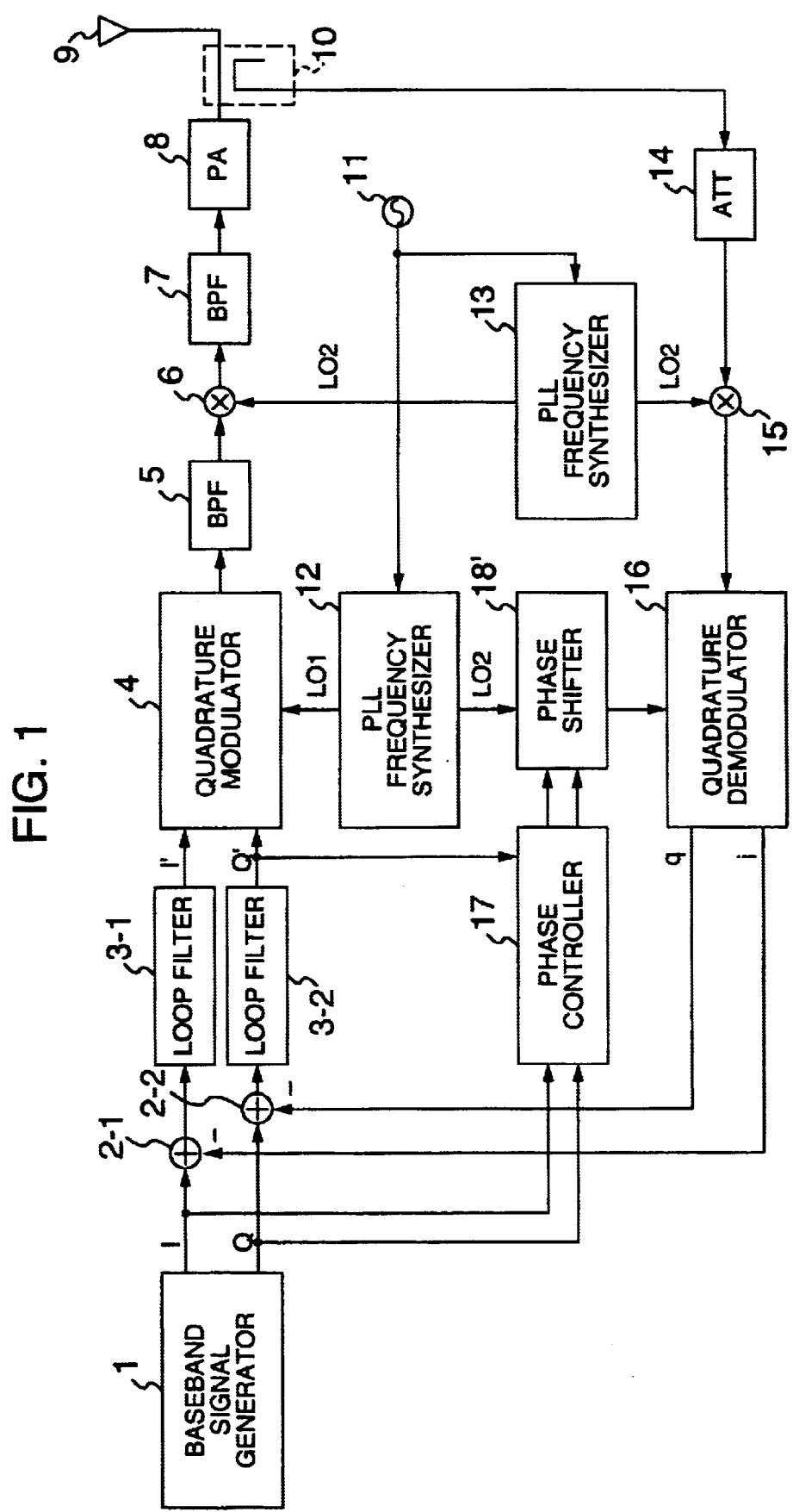
FIG. 1 is a block diagram showing an arrangement of a negative feedback circuit of a transmitter according to an embodiment of the invention.
Figure 2:
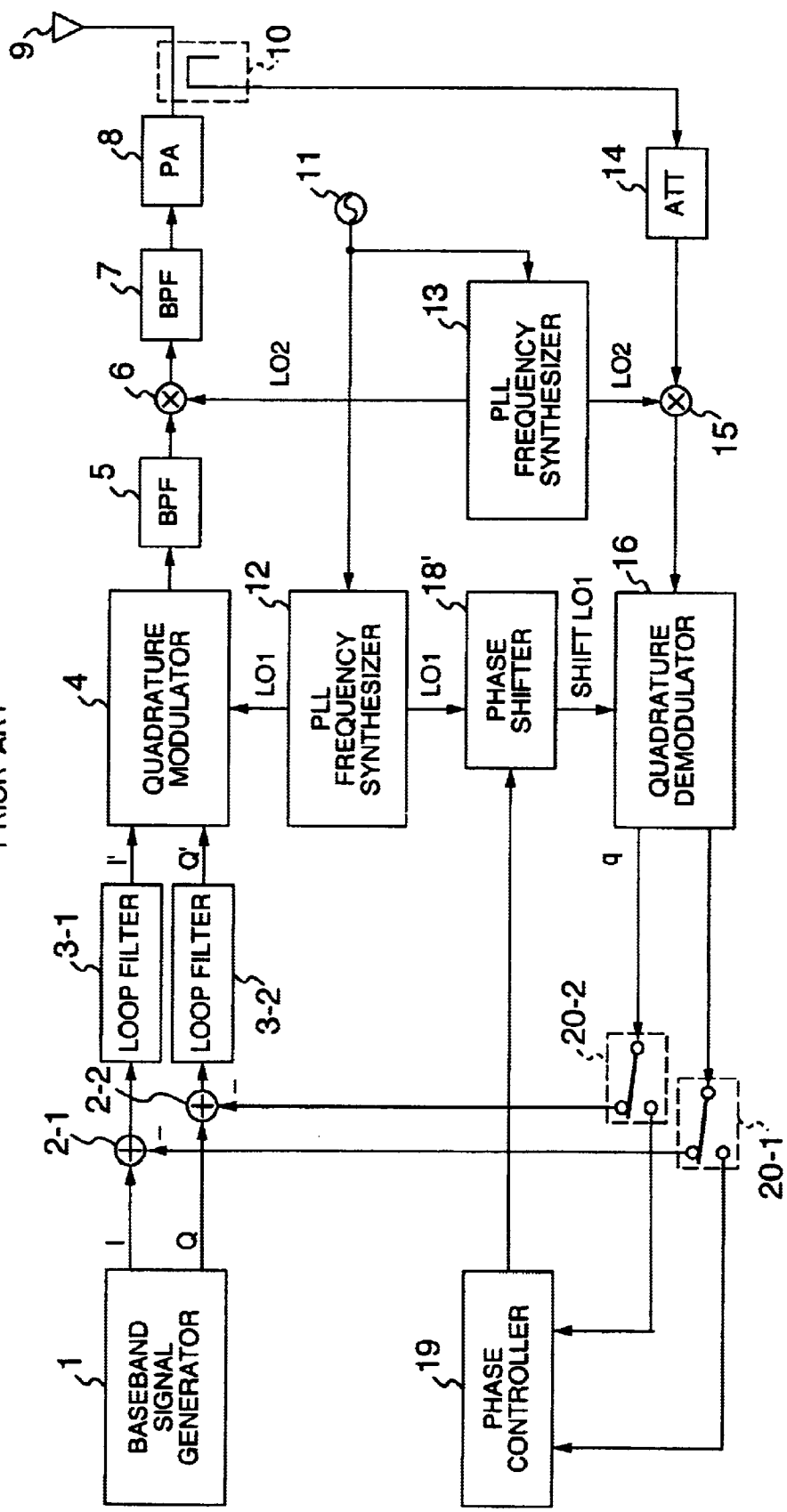
FIG. 2 is a block diagram showing an arrangement of the conventional negative feedback circuit.

One embodiment of the present invention will be described with reference to FIG. 1. FIG. 1 is a block diagram showing a quadrature modulation transmitter having an arrangement of a negative feedback circuit to which the present invention applies.

A baseband signal generator 1 operates to output an I-component and a Q-component of a baseband signal. Then, the I-component is added to a feedback signal in an adder 2-1. The adder 2-1 outputs the added signal to a loop filter 3-1. Likewise, the Q-component is added to the feedback signal in an adder 2-2. The adder 2-2 outputs the added signal to a loop filter 3-2. The loop filters 3-1 and 3-2 operate to restrict the bands of the I-component and the Q-component applied therein and then apply the band-restricted I and Q-components into a quadrature modulator 4.

A numeral 11 denotes a reference signal generator, which operates to generate a reference frequency signal and apply a reference signal into a PLL frequency synthesizer 12 and a PLL frequency synthesizer 13. The PLL frequency synthesizer 12 operates to generate a first LO signal on the basis of the reference signal and then apply the first LO signal into the quadrature modulator 4 and a phase shifter 18'. Further, the PLL frequency synthesizer 13 operates to generate a second LO signal on the basis of the reference signal and then apply the second LO signal into mixers 6 and 15. The phase shifter 18' operates to control the phase of the first LO signal to be inputted from the PLL frequency synthesizer 12 through the use of a control signal (phase difference information and phase delay and advance information) to be inputted from the phase controller 17. Then, the phase shifter 18' operates to apply the phase-controlled first LO signal into the quadrature demodulator 16.

The quadrature modulator 4 operates to orthogonally modulate the first LO signal by the I-component I' and the Q-component Q' of the baseband signal to be applied therein into a signal of the IF frequency band. Then, the modulator 4 operates to apply the modulated signal into a bandpass filter 5. The bandpass filter 5 operates to remove unnecessary components from the modulated signal applied therein and apply the resulting signal into the mixer 6. The mixer 6 operates to convert the modulated signal into a desired frequency through the use of the second LO signal outputted from the PLL frequency synthesizer 13 and then apply the converted signal into a bandpass filter 7. The bandpass filter 7 operates to remove unnecessary spurious components from the input signal and then apply the resulting signal into a power amplifier 8. The power amplifier 8 operates to amplify the input signal up to the specified output level and then send the amplified signal through an antenna 9.

This negative feedback amplifier is arranged to have a negative feedback linearizer based on the Cartesian loop. Hence, part of the output signal of the power amplifier 8 is fed back through a directivity coupler 10 and then applied into an attenuator 14. The attenuator 14 operates to adjust the power level of the input signal into a proper value and then apply the modified signal into a mixer 15. The mixer 15 operates to convert the signal applied from the attenuator 14 into an IF frequency by the use of the second LO signal and then apply the converted signal into the quadrature demodulator 16.

The quadrature demodulator 16 operates to orthogonally demodulate the first LO signal inputted from the phase shifter 18 by the baseband signals i and q of the I- and Q-components. The I-component is applied as the I-component i of the feedback signal into the subtracting input side of the adder 2-1. The Q-component is applied as the Q-component q of the feedback signal into the subtracting input side of the adder 2-2, for applying a negative feedback into the I and the Q-components, respectively.

Figure 3:
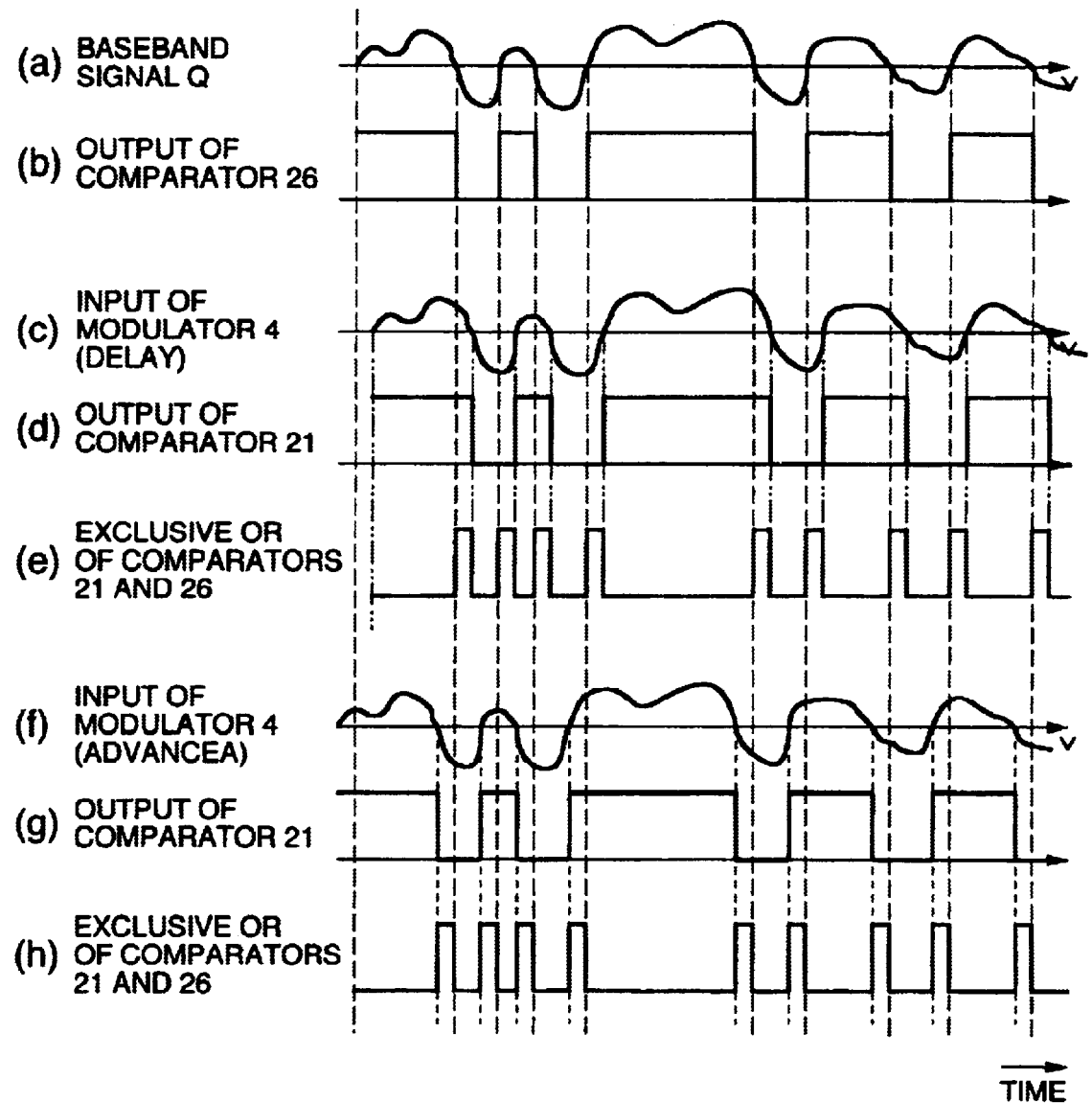
FIG. 3 is a time chart illustrating the operation of a method for controlling the phase according to an embodiment of the invention.
Figure 4:
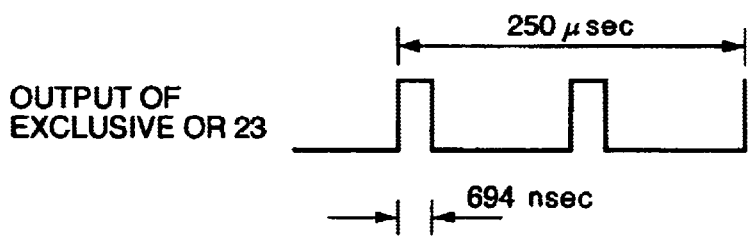
FIG. 4 is a chart showing an operation of an exclusive OR gate of a phase controller according to an embodiment of the invention.
Figure 5:
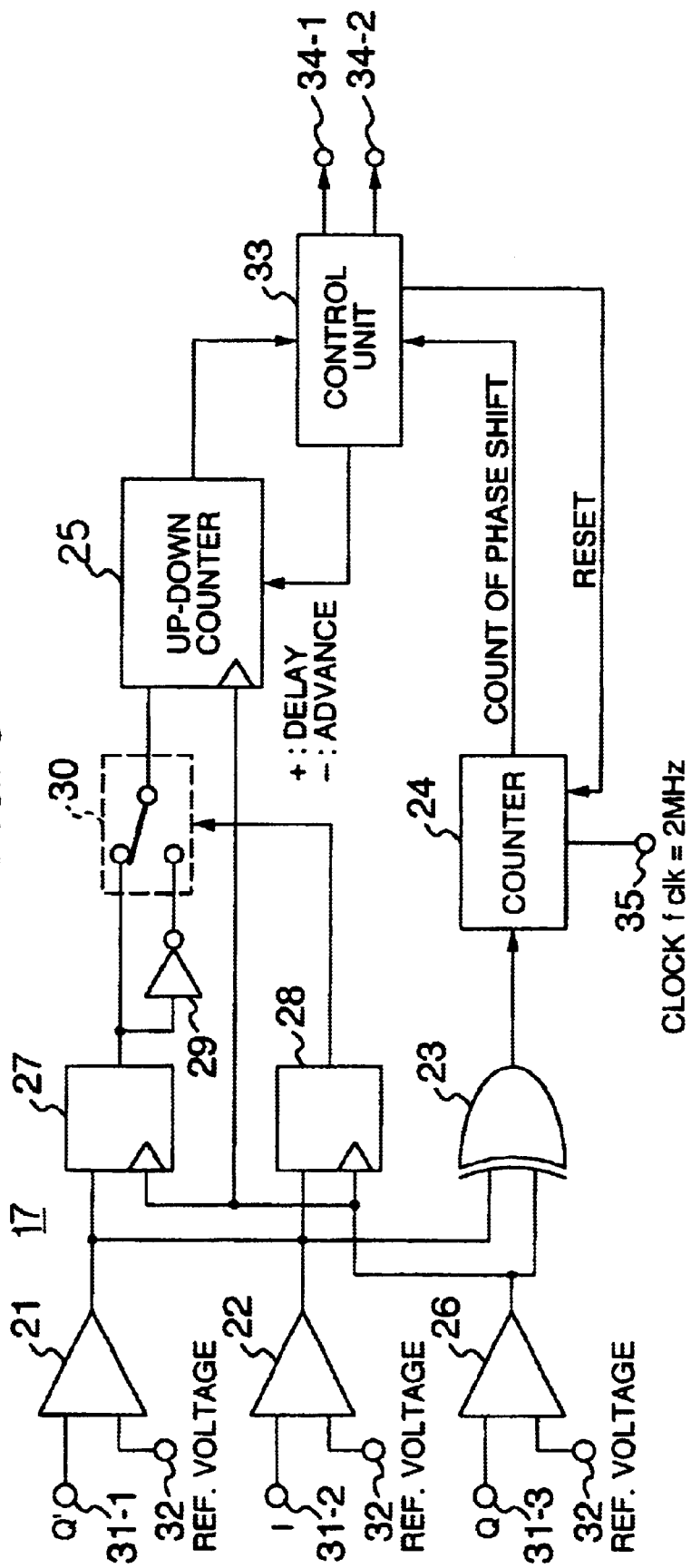
FIG. 5 is a block diagram showing a phase controller according to an embodiment of the invention.

In turn, the description will explain the method for detecting a phase error with reference to FIGS. 1, 3, 4 and 5. FIG. 3 is a time chart for illustrating the operation of the method for controlling the phase according to an embodiment of the invention. FIG. 4 is an explanatory view for illustrating an embodiment of an operation of an exclusive OR gate of the phase controller 17 (see FIG. 1). FIG. 5 is a detailed block diagram showing the phase controller 17 shown in FIG. 1.

At first, if the Q-component that corresponds to the output of the baseband signal generator 1 shown in FIG. 1 is made to be a signal (a) as shown in FIG. 3, this signal (a) and a reference voltage are both applied into a comparator 26 (see FIG. 5) in which the signal (b) of FIG. 3 appears.

Then, viewing the Q-component input Q' of the quadrature modulator 4, if the phase is delayed, the signal (c) is made to be as shown in FIG. 3. This signal Q' and the reference voltage are both applied into a comparator 21 (see FIG. 5) in which the signal (d) of FIG. 3 appears. If the exclusive OR gate 23 (see FIG. 5) takes an exclusive OR of the signals (b) and (d) of FIG. 3, the signal (e) of FIG. 3 takes place.

Then, if the phase is advanced on the input side of the quadrature modulator 4, the signal (f) of FIG. 3 takes place. This signal and the center voltage are applied into the comparator 21 in which the signal (g) of FIG. 3 takes place. By taking an exclusive OR of the signals (b) and (g) of FIG. 3, the signal (h) of FIG. 3 may be obtained.

Herein, viewing the signals (e) and (h) of FIG. 3, it is understood that the data corresponding to the lag (or the advance) time can be obtained. By counting a pulse width representing the time lag at a clock fclk with the counter 24, it is possible to measure the lag and correct the phase shift.

For example, considering the case of 4 kHz sine wave, once a 4 kHz sine wave is shifted ($\pi/180$ radian), the output of the exclusive OR may be obtained as a pulse having a width of 694 nsec at high level.

The clock at which 694 nsec can be counted is 1.44 MHz (=1/0.000000694). Hence, the clock is made to be 2 MHz. If 250 $\mu$sec (4 kHz=1/0.000250) is counted at 2 MHz, it is necessary to count 500 times (=2000000/4000). Further, if 694 nsec is counted twice, 2.8 counts are required. If, therefore, the high level of the exclusive OR is 2.8 counts or more at 500th count, the phase is changed once.

Figure 6:
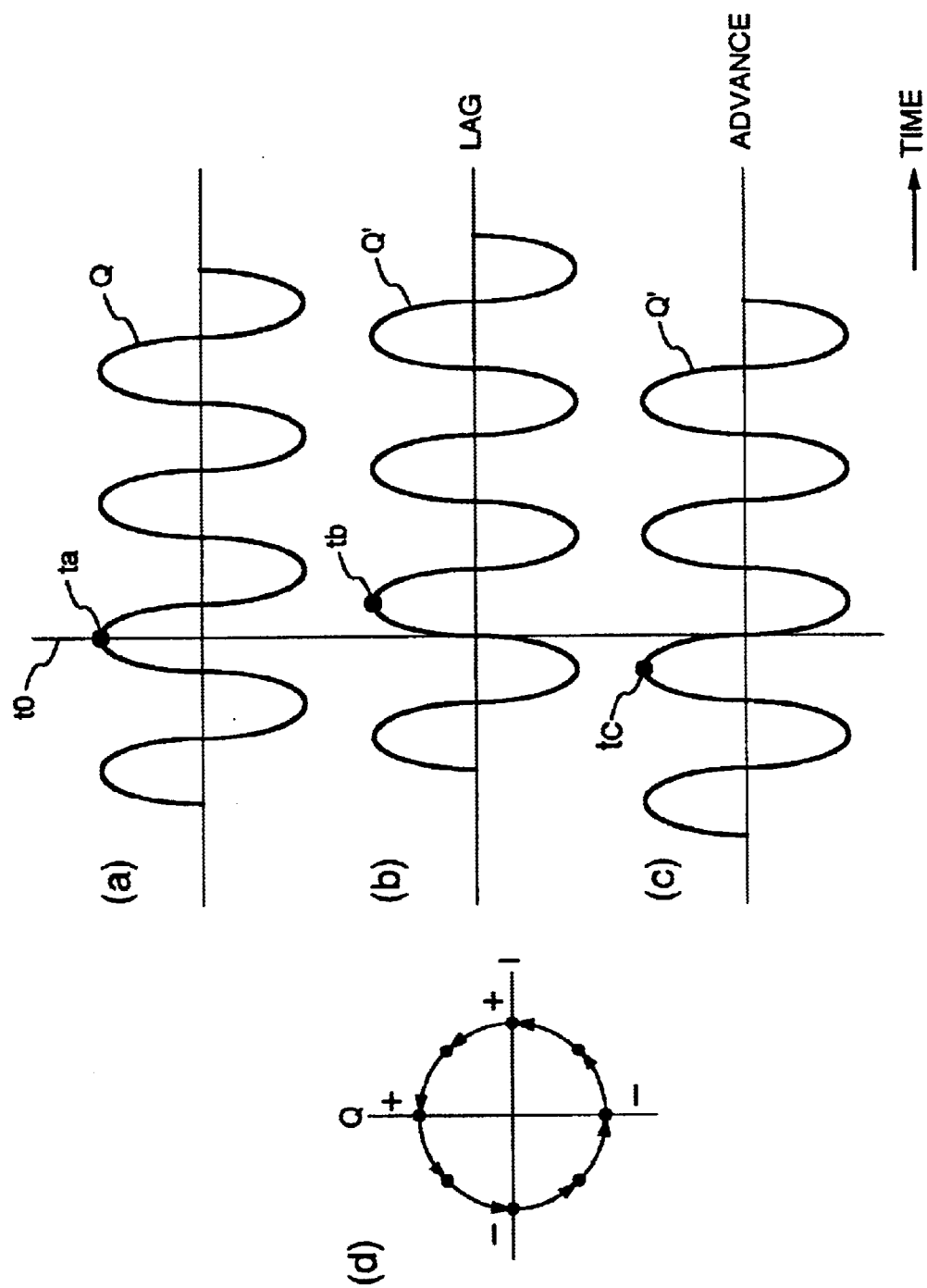
FIG. 6 is an explanatory chart illustrating the operation of the phase controller according to an embodiment of the invention.
Figure 7:
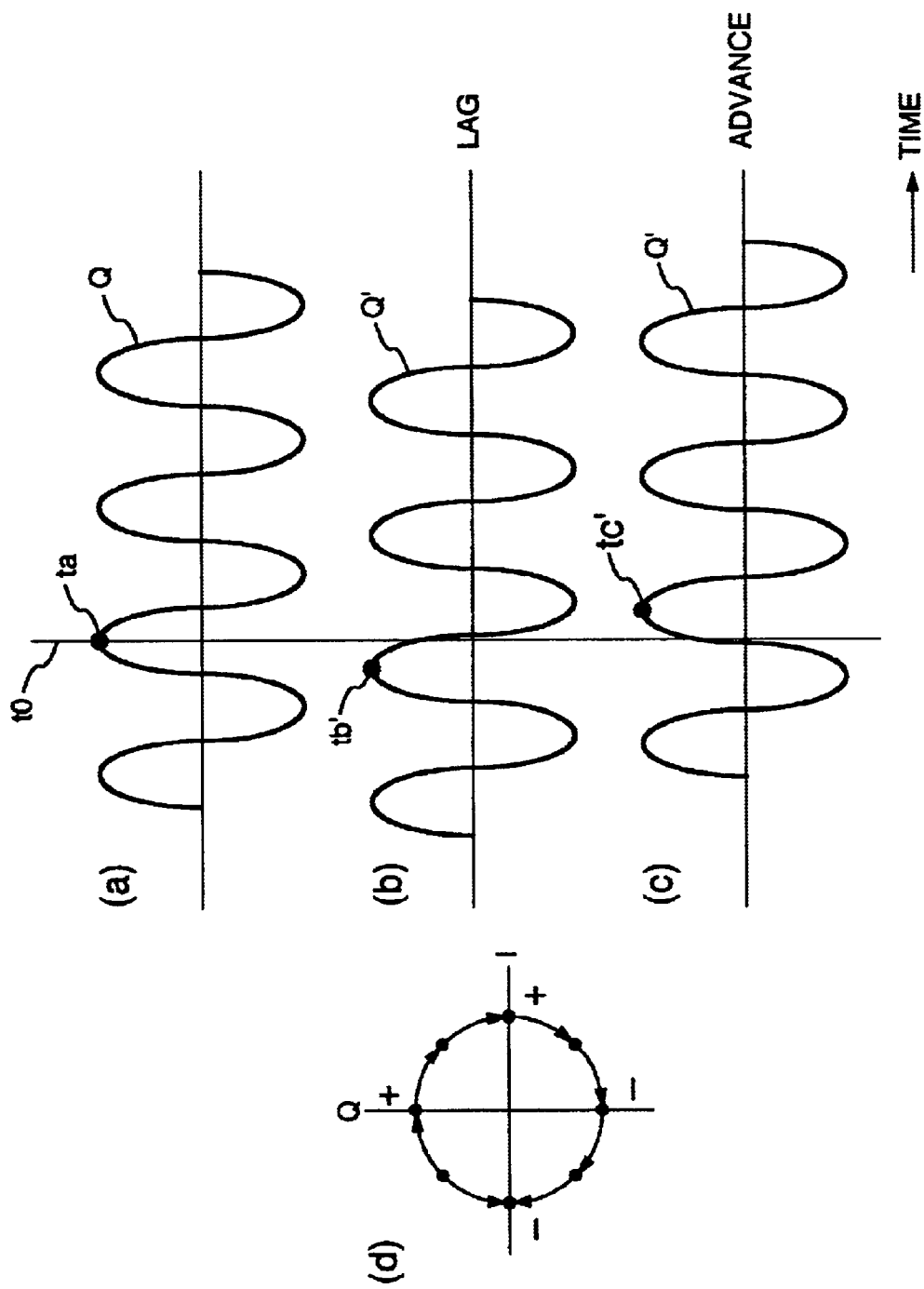
FIG. 7 is an explanatory chart illustrating the operation of the phase controller according to an embodiment of the invention.

Next, the description will explain the method for determining the phase control direction with reference to FIGS. 6 and 7.

The direction of the signal phase for controlling the phase is required to be determined on the clockwise rotation or the counterclockwise rotation of the signal phase on the I-Q coordinate. FIG. 6 is a chart showing the counterclockwise rotation of the signal phase, while FIG. 7 is a chart showing the clockwise rotation of the signal phase. For example, when the Q-component signal is changed from − into + in the polarity, if the I-component signal is +, the phase is rotated clockwise, while if the I-component is −, the phase is rotated counterclockwise. Like this, by determining if the I-component is positive or negative at a zero cross point of the Q-component signal, the direction of the phase control is set up.

FIG. 6 shows a baseband phase transition at a specific pattern in the $\pi/4$ shift QPSK system. FIG. 6 shows in (d) the constellation given each time the signal trace is shifted by $+\pi/4$ radian. FIG. 6 shows a time waveform (a) of the Q-component signal. FIG. 6 shows a waveform (b) of the Q-component in the output of the loop filter if the phase of the loop is delayed. FIG. 6 shows a waveform (c) of the Q-component in the output of the loop filter if the phase of the loop is advanced. Likewise, as shown (d) of in FIG. 7. FIG. 7 shows the constellation appearing in the case of transiting the signal trace by $-\pi/4$ radian. FIG. 7 shows a waveform (a) of the Q-component signal. FIG. 7 shows a waveform (b) of the Q-component in the output of the loop filter if the phase of the loop is delayed. FIG. 7 shows a waveform (c) of the Q-component in the output of the loop filter if the phase in the loop is advanced.

In the case of the counterclockwise rotation of the signal phase as shown in FIG. 6, if a peak point ta that was located at a reference time point as shown in (a) of FIG. 6 is lagged behind the reference time point t0 like the phase in the loop as shown in (b) of FIG. 6, the signal phase is rotated counterclockwise, so that the output of the loop filter is delayed in phase. Further, as shown in (c) FIG. 6, if the peak point tc of the phase in the loop goes further than the reference time point t0, the output of the loop filter is advanced in phase.

Conversely with the case of FIG. 6, FIG. 7 shows the clockwise rotation of the signal phase. If the peak point ta that was located at a reference time point t0 as shown in (a) of FIG. 7 is advanced from the reference time point to like the peak point tb' of the phase in the loop as shown in (b) of FIG. 7, the output of the loop filter is delayed in phase. Further, as shown in (c) of FIG. 7, if the phase in the loop is delayed from the reference time point to like the peak point tc', the output of the loop filter is advanced in phase.

The foregoing status will be described with reference to FIG. 5. FIG. 5 is a block diagram showing a phase controller 17 according to an embodiment of the present invention. Numerals 31-1, 31-2 and 31-3 denote input terminals. A numeral 32 denotes a reference voltage input terminal. Numerals 21, 22 and 26 denote comparators whose reference voltage is a zero cross point of an input from the reference voltage input terminal 32. The comparator 21 is inputted at its input terminal 31-1 with a Q-component signal (Q') outputted by the loop filter 3-2. The comparator 22 is inputted at its input terminal 31-2 with an I-component signal (I) outputted by a baseband signal generator 1. The comparator 26 is inputted at its input terminal 31-3 with a Q-component signal (Q) outputted by the baseband signal generator 1. Those comparators operate to output their own results. A numeral 23 denotes an exclusive OR circuit. A numeral 24 denotes a counter. A numeral 25 denotes an up-down counter. Numerals 27 and 28 denote flip-flops. A numeral 29 denotes an inverter. A numeral 30 denotes a switch. A numeral 33 denotes a control unit. A numeral 34 denotes an output terminal. A numeral 35 denotes a clock input terminal.

At first, the description will explain the operation of deriving a phase difference.

In FIG. 5, the output of the comparator 21 is applied to one input terminal of the exclusive OR circuit 23. The output of the comparator 26 is applied into the flip-flop 28 and the other input terminal of the exclusive OR circuit 23. The output of the exclusive OR circuit 23 corresponds to the logical operation result as shown in the operation that has been described with reference to FIG. 3. A pulse signal as shown in FIG. 4 is given to the counter 24. The counter 24 operates to count in response to a clock signal fclk (fclk=2 MHz) that corresponds to a high-level pulse being inputted therein and then send the counts as a phase difference count to the control unit 33. As mentioned above, herein, the operation is executed to not measure the absolute value of the phase difference but detect if the phase shift from the reference value exists. If the count number exceeds a certain value, it is determined as a phase shift and the control unit 33 operates to output the control signal produced by shifting the phase angle of the carrier only by one degree ($\pi/180$ radian). One shift adjustment is not limited to one degree. It may depend on the request response characteristic of the system.

In turn, the description will be oriented to the operation for determining the direction for shifting the phase.

In FIG. 5, the output of the comparator 26 is applied into the flip-flop 27 and the up-down counter 25 as well as the flip-flop 28 and the exclusive OR circuit 23. Further, the output of the comparator 21 is applied into the exclusive OR circuit 23 as well as the flip-flop 28. The output of the comparator 22 is applied into the flip-flop 28. With respect to the direction for shifting the phase, the advance or the lag of the phase is determined on the state of the I-component signal of the output of the comparator 21 that is latched by the flip-flop 27 with the output signal of the comparator 26. The determination information on the advance or the lag of the phase is outputted from the inverter 29 and the switch 30. The switch 30 is switched on the determination as to if the I-component of the output of the comparator 22 is positive or negative when the Q-component is at a zero cross point. The output of the comparator 22 is latched by the flip-flop 28 with the output of the comparator 26. The output of the switch 30 is applied into the up-down counter 25. If the input signal is positive (+), it is determined to be lagged, while if the signal is negative (−), it is determined to be advanced. The result is sent to the control unit 33. The control unit 33 operates to produce a control signal for controlling the phase of the phase shifter 18' from two pieces of information, "phase difference" and "phase delay or advance" having been inputted therein and then output the two DC voltages at the output terminal 34.

In turn, the phase shifter 18' will be described with reference to FIGS. 9 and 10.

Figure 9:
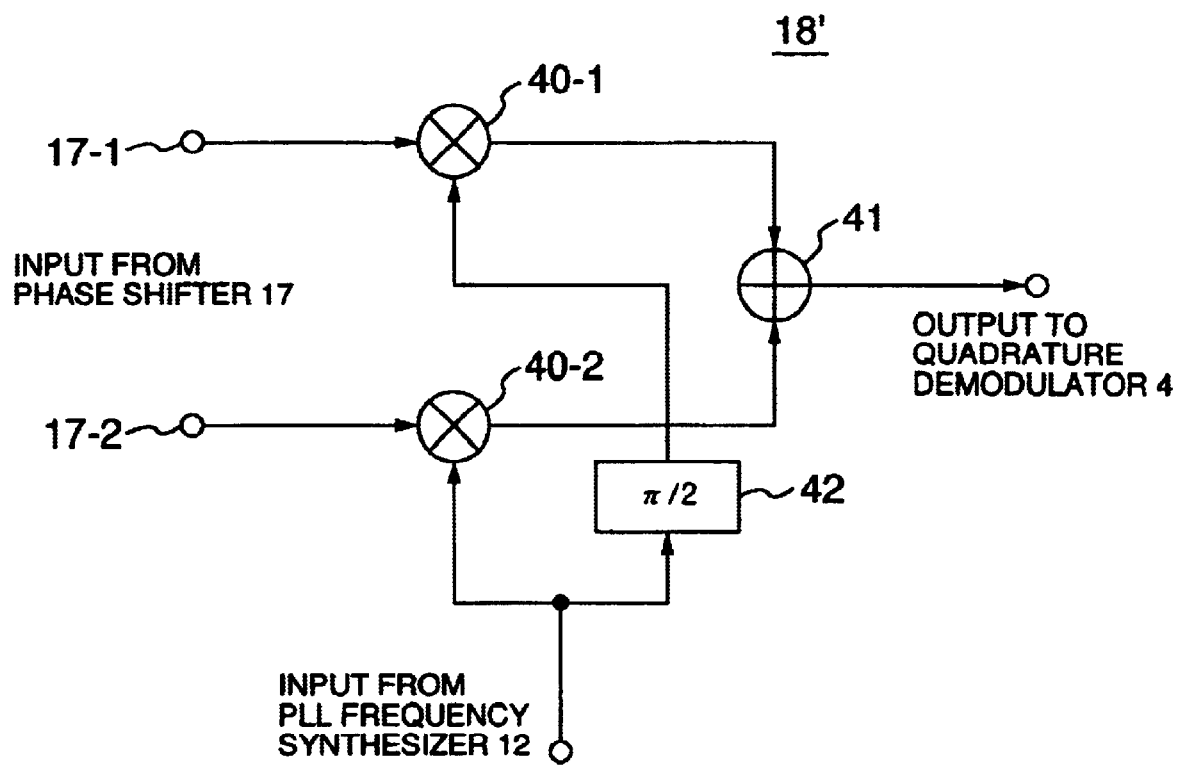
FIG. 9 is a block diagram showing a concrete arrangement of the phase shifter shown in FIG. 1.

FIG. 9 is a block diagram showing an arrangement of one embodiment of the phase shifter 18'. The two DC voltages are applied from the phase controller 17 into mixers 40-1 and 40-2 through input terminals 17-1 and 17-2. Further, the first LO signal, which corresponds to the output from a PLL frequency synthesizer 12, is applied into the mixer 40-2 and a 90-degree phase shifter 42. The 90-degree phase shifter 42 operates to shift the phase of the first LO signal by 90 degrees ($\pi/2$) and then apply the shifted signal into the mixer 40-1. The outputs of the mixers 40-1 and 40-2 are applied into an adder 41 in which they are added. Then, the added signal is sent to the quadrature demodulator 16.

Figure 10:
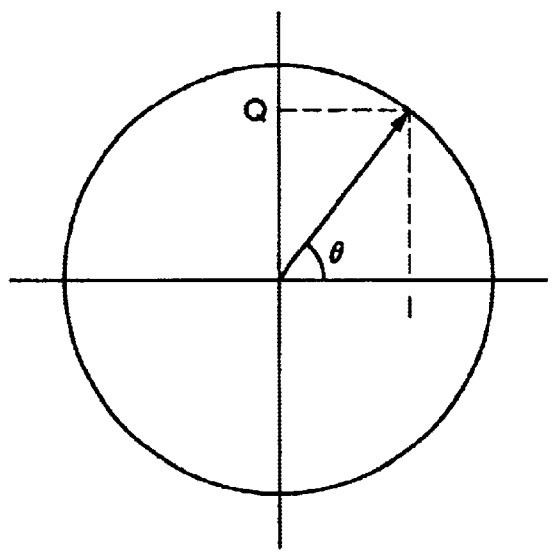
FIG. 10 is a chart showing an I-Q coordinate for illustrating the operation of the phase shifter shown in FIG. 9.

FIG. 10 is an explanatory view for illustrating the principle of operation of the phase shifter 18', in which an axis of abscissa denotes an I-component and an axis of ordinate denotes a Q-component. As shown in FIG. 10, the operation of FIG. 9 is executed to apply a DC voltage on the I and the Q-components for performing the quadrature modulation and then feed the same signal as the non-modulated carrier signal. At a time, the initial phase angle $\theta$ may be varied by the voltage of the I and the Q-components, so that the non-modulated carrier signal may be outputted at any initial phase. That is, the phase shifter 18' may be realized with an ordinary quadrature modulator.

Figure 8B:
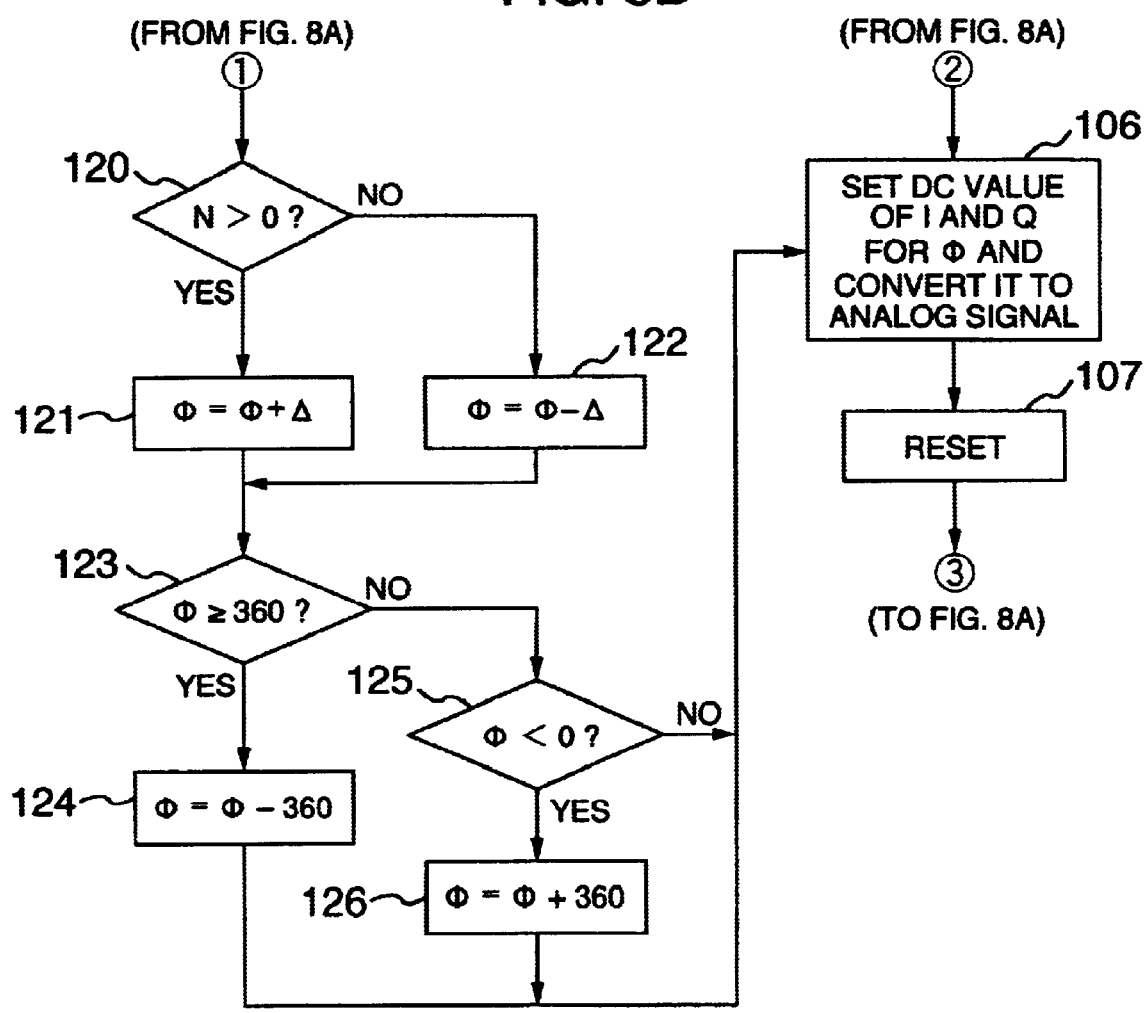

The phase controller 17 shown in FIG. 5 may be implemented by combining a logical gate circuit with a counter and a memory. Alternatively, it may be implemented by software to be executed by the DSP or the microcomputer (not shown). FIGS. 8A and 8B are flowcharts illustrating the operation of the phase shifter 17 except the comparators 21, 22 and 26 shown in FIG. 5 is implemented by software. Hereafter, this flowchart will be described.

At a step 100, the operation is executed to set to zero a count value K of the counter 24, an initial set value $\phi$ of a phase angle on the I-Q coordinates, a flag value M for indicating if the Q-component of the baseband signal is changed from a low level to a high level. Then, at a step 101, the operation is executed to read an I-component baseband input signal (output of the comparator 22), a Q-component baseband input signal (output of the comparator 26), a Q-component baseband adding signal Q' (output of the comparator 21).

Next, at a step 102, the value X of the exclusive OR of the outputs of the comparators 21 and 26 is calculated. At a step 103, it is determined if X is one (1). If X is 1, the operation goes to a step 104. If X is not 1, the operation goes back to the step 101. At the step 104, the value K of the phase difference counter (corresponding to the counter 24) is incremented by 1. Then, at a step 105, it is determined if the count value K is greater than the set reference value L of the phase difference counter. If the count value K is greater than the reference value L, the operation goes to a step 106. If it is not, the operation goes back to the step 101.

At a step 106, the DC voltage value of the I-component and the Q-component corresponding to the phase shift set value $\phi$ determined at steps 110 to 126 (to be discussed below) are read out of a memory (not shown) and then are outputted as an analog signal. (This operation is executed by the control unit 33). That is, the memory like a ROM stores the I-component voltage and the Q-component voltage corresponding to the phase value of each one degree in the range of 1 to 360 degrees of the φ value. The phase shifter 18' is controlled by the voltage value determined at the step 106 and then the phase of the carrier is reset at the step 107.

On the other hand, the flow of detecting the advance and the delay of the phase will be described. At the step 110, it is determined if the flag value M is at high level (1). If the flag M is at high level, it indicates the previous Q-component was at low level. Then, at a step 111, it is determined if the Q-component baseband input signal Q is at high level. If it is at high level, at a step 112, the flag M is reset to zero. At a step 110, if the flag M is at low level, it indicates the previous Q-component was at high level. Then, at a step 113, it is determined if the Q value is at low level. If it is at low level, at a step 114, the flag M is set to 1. If it is not at low level, the operation goes back to the step 101 from which the foregoing process is repeated. The operation up to this point corresponds to the clocking operation performed by the flip-flops 27 and 28.

Next, at a step 115, it is determined if the I-component baseband input signal I is at high level. If the I value is at high level, at a step 116, it is determined if the Q-component baseband adding signal Q'is at high level. At the step 115, if it is determined that the I value is not at high level, at a step 117, it is determined that the Q-component baseband adding signal Q' is at high level. The operation at the steps 110 to 117 corresponds to the operations of the flip-flops 27 and 28, the inverter 29 and the switch 30.

Then, if the Q' value is determined to be at high level at the step 116 or the Q' value is determined not to be at high level at the step 117, at the step 118, the count value N of the counter (corresponding to the up-down counter 25) is decremented by 1. If the Q' value is determined not to be at high level at the step 116 or the Q' value is determined to be at high level at the step 117, at the step 119, the count value N of the counter is incremented by 1.

Further, at the step 120, it is determined if the count value N is greater than zero. If the count value is greater than zero, it indicates the phase is delayed. Then, at the step 121, a predetermined phase shift Δ is added to the current phase set value φ. If the count value N is not greater than zero, it indicates the phase is advanced. At the step 122, a given phase shift Δ is subtracted from the current phase set value φ.

Next, at a step 123, it is determined if the updated phase shit set value φ is equal to or greater than 360 degrees. If φ is equal to or greater than 360 degrees, at the step 124, the operation of φ−360 is executed and then the result is set as a new φ. At the step 123, if it is determined that φ is smaller than 360 degrees, at the step 125, it is determined φ is smaller than zero. If φ is smaller than zero, at the step 126, the operation of φ+360 is executed and then the result is set as a new φ. The determined φ value is used at the step 106.

In the foregoing embodiment, the comparison of the phase difference is executed by using the Q-component Q of the input signal and the Q-component Q' of the feedback signal. Further, the rotating direction is derived by using the I-component I and the Q-component Q of the input signal and the Q-component Q' of the feedback signal. For comparison of the phase difference, in place of the Q-component Q' of the feedback signal, the I-component I' of the feedback signal may be used. Also for deriving the rotating direction, it is obvious that the I-component I and the Q-component of the input signal and the I-component I' of the feedback signal may be used.

As set forth above, according to the present invention, the phase control is made possible by observing the Q-component and the I-component of the baseband signal. Since the automatic phase control may be executed during the normal operation, the special test signal is not required for the purpose of adjusting the phase. Further, the switch for changing the open loop to the closed loop or vice versa is not required, so that the precise phase control can be executed. Hence, as keeping the Cartesian loop closed and if the phase in the loop is changed by the temperature variation and the aging, the invention may follow the phase change, so that the invention may stabilize the phase characteristic in operation, stabilize the output operation characteristic, and prevent the degrade of the spurious characteristic, and so forth.

What is claimed is:

1. A power amplifier having a negative feedback circuit for a transmitter, comprising:
   an input terminal for inputting an I-component baseband signal and a Q-component baseband signal;
   an adder, coupled with said input terminal, for adding said I-component baseband signal to an I-component baseband feedback signal to produce an I-component adding signal and adding said Q-component baseband signal to a Q-component baseband feedback signal to produce a Q-component adding signal;
   an oscillator for generating a carrier signal;
   a modulator for orthogonally modulating said carrier signal by said I-component adding signal and said Q-component adding signal;
   an amplifier circuit, coupled with said modulator, for amplifying said modulator signal;
   a demodulator circuit, coupled with said amplifier, for orthogonally demodulating part of an output of said amplifying circuit and said carrier signal and outputting said I-component baseband feedback signal and a Q-component baseband feedback signal; and
   a phase controller, coupled with said input means, for comparing a phase of a selected one of said I-component baseband signal and said Q-component baseband signal with a phase of said adding signal corresponding to said selected component baseband signal for detecting if a phase shift exists, wherein said phase controller adjusts the phase of said carrier signal so that said phase shift can be made smaller, when said phase shift exists.

2. A power amplifier as claimed in claim 1, wherein said phase controller includes a detector for detecting if said phase shift between either one of said I-component adding signal and said Q-component adding signal and said baseband signal corresponding thereto is advanced or lagged.

3. A power amplifier as claimed in claim 1, wherein said phase controller includes a phase control unit and a phase shifter, and said phase control unit includes:
   a first binary signal generator for inputting said I-component baseband signal and generating a binary signal having a high-level or a low-level based on said I-component baseband signal;
   a second binary signal generator for inputting said Q-component baseband signal and generating a binary signal having a high-level or a low-level based on said Q-component baseband signal;
   a third binary signal generator for inputting any one of said I and Q-component baseband adding signals and generating a binary signal having a high-level or a low-level on any one of said 1- and Q-component baseband adding signals;
   an output terminal for outputting a signal of an exclusive OR of said binary signal generated by one of said first and second binary signal generators and said binary signal generated by said third binary signal generator;

a counter for counting a period of the output signal of said output terminal with a predetermined clock pulse; and a controller for generating said control signal if the count value of said counter exceeds a predetermined value, wherein said phase shifter operates to change the phase of said carrier by a predetermined amount of response to said control signal given from said phase control unit.

4. A power amplifier as claimed in claim 3, wherein said phase control unit further includes a detector for detecting an advance or delay of a phase, wherein said detector includes:

a first latch circuit for latching a value of said binary signal outputted by said third binary signal generator in response to one of said binary signals outputted from said first and second binary signal generators;

a second latch circuit for latching a value of said binary signal outputted by said third binary signal generator in response to one of said binary signals outputted from said first and second binary signal generators;

an inverter for inverting the polarity of the latching output of said first latch circuit;

a switch for selectively outputting any one of the latched output of said first latch circuit and the output of said first latch circuit and said inverter in response to the latched output of said second latch circuit; and an up-down counter for accumulating the output of said switch in response to the binary signal output from said second binary signal generator and then outputting said accumulated value; and wherein said controller generates a control signal for controlling a carrier for each of the I-component and the Q-component by a predetermined value in response to the output of said up-down counter and the output of said counter.

5. A phase control method for a power amplifier having a negative feedback circuit for a transmitter, comprising the steps of:

inputting an I-component baseband signal and a Q-component baseband signal;

adding said I-component baseband signal to an I-component baseband feedback signal for producing an I-component adding signal and adding said Q-component baseband signal to a Q-component baseband feedback signal for producing a Q-component adding signal;

generating a carrier signal;

orthogonally modulating said carrier signal by said I-component adding signal and said Q-component adding signal;

amplifying said modulated signal;

orthogonally demodulating part of the amplified modulated signal and said carrier signal and outputting and I-component baseband feedback signal and a Q-component baseband feedback signal; and comparing a phase of a selected one of said I-component baseband signal and said Q-component baseband signal with a phase of said adding signal corresponding to said selected component baseband signal so as to detect a phase shift; and if a phase shift exists, adjusting the phase of said carrier signal so that said phase shift becomes smaller.

6. A control method as claimed in claim 5, wherein the detection of said phase shift and said phase adjustment are executed while said negative feedback circuit is operating in a closed loop.

* * * * *